(12) United States Patent
Miller

(10) Patent No.: US 7,977,958 B2
(45) Date of Patent: Jul. 12, 2011

(54) BI-DIRECTIONAL BUFFER FOR INTERFACING TEST SYSTEM CHANNEL

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 204 days.

(21) Appl. No.: 11/846,446

(22) Filed: Aug. 28, 2007

(65) Prior Publication Data

US 2007/0290676 A1   Dec. 20, 2007

Related U.S. Application Data

(63) Continuation of application No. 11/018,211, filed on Dec. 21, 2004, now Pat. No. 7,262,624.

(51) Int. Cl.
*G01R 31/20* (2006.01)
(52) U.S. Cl. .............................. 324/754.07; 324/754.01
(58) Field of Classification Search .......... 324/754–765, 324/158.1; 439/482
See application file for complete search history.

(56) References Cited

U.S. PATENT DOCUMENTS

| | | | | |
|---|---|---|---|---|
| 5,070,297 A * | 12/1991 | Kwon et al. | ................... | 324/754 |
| 5,087,874 A | 2/1992 | Robinson | | |
| 5,184,029 A | 2/1993 | King | | |
| 5,270,660 A * | 12/1993 | Werner et al. | ................. | 324/457 |
| 5,323,115 A * | 6/1994 | Werner, Jr. | ..................... | 324/457 |
| 5,550,480 A | 8/1996 | Nelson et al. | | |
| 5,956,280 A * | 9/1999 | Lawrence | ..................... | 365/201 |
| 6,008,664 A * | 12/1999 | Jett et al. | ........................ | 324/765 |
| 6,087,843 A | 7/2000 | Pun et al. | | |
| 6,157,231 A | 12/2000 | Wasson | | |
| 6,181,145 B1 * | 1/2001 | Tomita et al. | .................. | 324/754 |
| 6,313,657 B1 * | 11/2001 | Hashimoto | .................... | 324/763 |
| 6,316,657 B1 * | 11/2001 | Takemoto | ........................ | 560/41 |
| 6,339,338 B1 | 1/2002 | Eldridge et al. | | |
| 6,380,755 B1 * | 4/2002 | Sato | .............................. | 324/765 |
| 6,603,323 B1 | 8/2003 | Miller | | |
| 6,774,653 B2 | 8/2004 | Gold et al. | | |
| 6,856,129 B2 * | 2/2005 | Thomas et al. | ............. | 324/158.1 |
| 6,942,382 B2 * | 9/2005 | Demeocq | ....................... | 374/179 |
| 7,013,230 B2 * | 3/2006 | Sekino | ........................... | 702/117 |
| 7,154,259 B2 | 12/2006 | Miller | | |
| 7,180,313 B2 * | 2/2007 | Bucksch | ........................ | 324/754 |
| 7,262,624 B2 | 8/2007 | Miller | | |
| 2003/0001678 A1 * | 1/2003 | Miyazawa | .................... | 330/308 |
| 2004/0085059 A1 | 5/2004 | Smith | | |
| 2006/0049820 A1 | 3/2006 | Miller | | |

(Continued)

FOREIGN PATENT DOCUMENTS

EP    069072    1/1983

(Continued)

*Primary Examiner* — Ha Tran T Nguyen
*Assistant Examiner* — Richard Isla Rodas
(74) *Attorney, Agent, or Firm* — Kirton & McConkie

(57) ABSTRACT

An emitter follower or source follower transistor is provided in the channel of a wafer test system between a DUT and a test system controller to enable a low power DUT to drive a test system channel. A bypass resistor is included between the base and emitter of the emitter follower transistor to enable bi-directional signals to be provided between the DUT channel and test system controller, as well as to enable parametric tests to be performed. The emitter follower transistor and bypass resistor can be provided on the probe card, with a pull down termination circuit included in the test system controller. The test system controller can provide compensation for the base to emitter voltage drop of the emitter follower transistor.

16 Claims, 3 Drawing Sheets

U.S. PATENT DOCUMENTS

2006/0244433 A1* 11/2006 Nakahara .................. 324/76.11

FOREIGN PATENT DOCUMENTS

| | | |
|---|---|---|
| GB | 2223901 | 4/1990 |
| JP | 04-095782 | 3/1992 |
| JP | 04-19880 | 7/1992 |
| JP | 2003-043079 | 2/2003 |

\* cited by examiner

BI-DIRECTIONAL BUFFER FOR INTERFACING TEST SYSTEM CHANNEL

BACKGROUND

1. Technical Field

The present invention relates in general to a test system for testing integrated circuit Devices Under Test (DUTs). More particularly, the present invention relates to a system for effective reception of low power signals transmitted from a DUT through the wafer test system.

2. Related Art

FIG. 1 shows a simplified block diagram of a typical test system for testing DUTs on a semiconductor wafer. The test system includes a test controller or tester 4 connected by a communication cable 6 to a test head 8 and probe card 18. The test system further includes a prober made up of a stage 12 for mounting a wafer 14 being tested, the stage 12 being moved into contact with probes 16 on the probe card 18, the probes 16 for contacting pads of the DUTs formed on the wafer. Examples of the probes 16 include resilient spring probes, pogo pins, cobra type probes, conductive bumps or other forms of probes for contacting DUTs that are known in the art. Cameras 20 and 22 are shown attached to the prober stage 12 and the test head 8 to enable precise alignment of the probes 16 with contacts of DUTs formed on the wafer 14.

In the test system, test data is generated by the test controller 4 and transmitted through the communication cable 6 to the test head 8. Test results are then provided from DUTs on the wafer through the test head 8 back to the test controller 4. The test head 8 contains a set of test channels. Typically test data provided from the test controller 4 is provided through individual tester channels through the cable 6 that are separated in the test head 8 so that each channel is carried through the probe card 18 to a separate one of the probes 16. The channels are linked from the test head 8 to the probe card 18 by electrical connections 24.

Each of the probes 16 typically contacts a single input/output (I/O) terminal or pad on a DUT of the wafer 14 being tested. Each tester channel can either transmit a test signal to a DUT input or monitor a DUT output signal to determine whether the IC is behaving as expected.

FIG. 2 shows details illustrating a channel 31 provided between the test controller 4 and a DUT $35_1$. As shown, the test controller 4 for the channel 31 shown includes a bi-directional buffer with an output buffer portion 30 connecting to channel line 31 to transmit signals, and an input buffer portion 32 receiving signals from line 31. As in FIG. 1, the channel line 31 of FIG. 2 is provided from the test controller 4 through test head 8, connectors 24, probe card 18, and one of probes 14 to a pad on a DUT $35_1$. The channel line 31 is shown as a 50 Ohm line typically set to match the impedance to and from the test system. Once testing is complete, the wafer is diced up to separate the DUTs $35_1$-$35_3$.

A drawback to the test system illustrated in FIGS. 1 and 2 is that a DUT output signal in some cases will not have sufficient power to adequately drive the 50 Ohm line interface to the tester. It would be desirable to provide a test system that can test signals from a DUT in one direction, including low power signals that cannot drive a 50 Ohm test line, while simultaneously providing a signal path from the tester to the DUT in the reverse direction. Another key requirement of such an interface is to not interfere with DC parametric measurements, such as leakage test measurements, made by the test system.

SUMMARY

In accordance with the present invention, circuitry is provided for a test system to enable a low power or high impedance DUT driven signal to drive a low impedance [50 Ohm] tester channel while simultaneously allowing bi-directional signaling between the tester and the DUT.

The circuitry according to the present invention includes an emitter follower or source follower transistor provided in a test channel between a DUT and test controller to drive the channel transmission line. The emitter follower or source follower transistor can be provided on the probe card, with circuitry in the test controller used to provide a pull down termination.

The circuit according to the present invention further enables bi-directional signaling between the DUT channel and test controller, recognizing that two way signals are typically prevented when a buffer is placed in the channel. Bi-directional signaling is provided by using a bypass resistor between the base and emitter of the emitter-follower transistor or gate-source of a source-follower transistor allowing the DUT to drive the test controller through the transistor, and allowing the test controller to drive a signal back to the DUT through the bypass resistor. The bypass resistor also allows leakage measurements (force voltage, measure current or force current, measure voltage) to be made by the tester since the resistor value is relatively small compared to the low leakage currents typically being measured. When the tester is driving the signal to the DUT, the DUT input is high impedance and hence there is little or no voltage drop across the resistor and Vbe of the transistor is near zero volts insuring the transistor is off. Provided the collector voltage is larger than the maximum tester drive voltage (Vdd or Vdd+Vbe volt), both the base and emitter junctions of the buffer will be reversed biased with respect to the collector, and no current will flow to or from the transistor.

When the DUT is driving the test channel, a termination for the emitter follower transistor is provided at the tester end of the transmission line by the test controller. A typical test controller provides two convenient methods for providing this termination. The first method is to use the test controller driver programmed to a DC low level DUT output voltage less the Vbe voltage drop of the transistor, typically about 1 volt. The other method is to use the programmable channel termination option if the test controller provides this capability. The programmable channel termination can be programmed to provide the current sink or pull down termination when the low power DUT is driving the channel using the emitter-follower or source-follower transistor, and then eliminate the pull-down termination when the emitter-follower or source-follower transistor is not used. The test controller functioning as a pull-down termination can further be programmed to compensate for the base to emitter voltage drop experienced by the emitter-follower transistor when operating to provide accurate test results.

BRIEF DESCRIPTION OF THE DRAWINGS

Further details of the present invention are explained with the help of the attached drawings in which.

DETAILED DESCRIPTION

Figure 1:
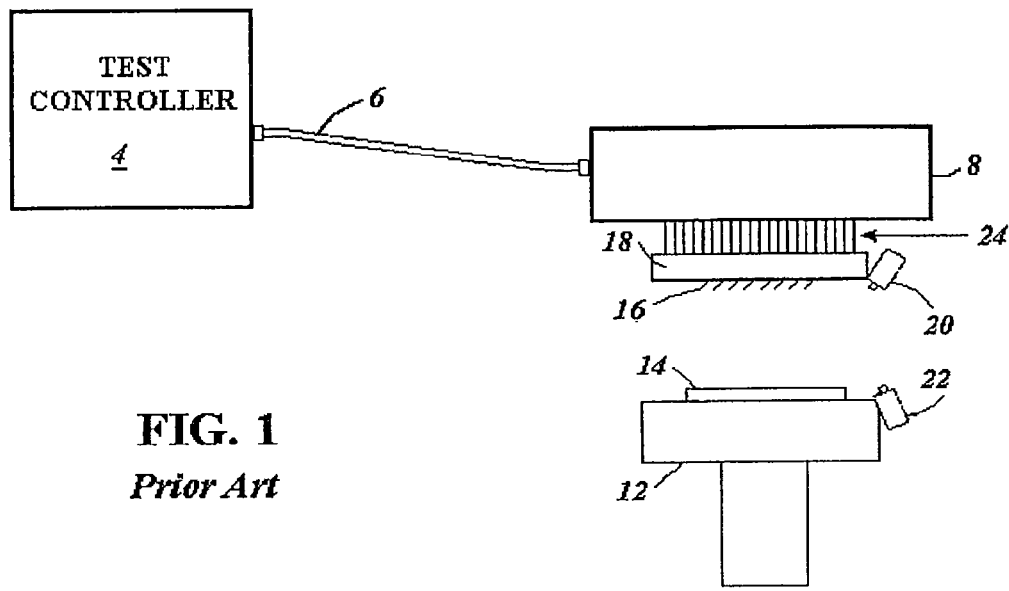
FIG. 1 shows a simplified block diagram of a conventional test system for testing DUTs on a semiconductor wafer.
Figure 2:
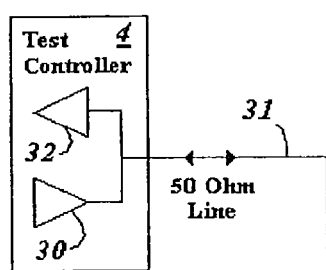
FIG. 2 shows more details of a conventional test system illustrating a channel provided through the test system.
Figure 2:
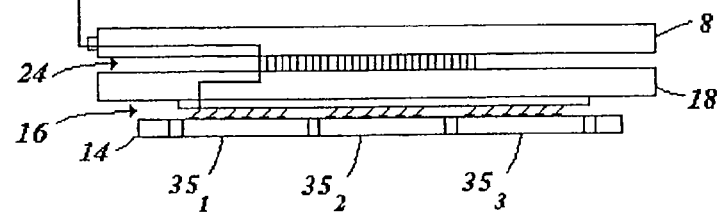
Figure 3:
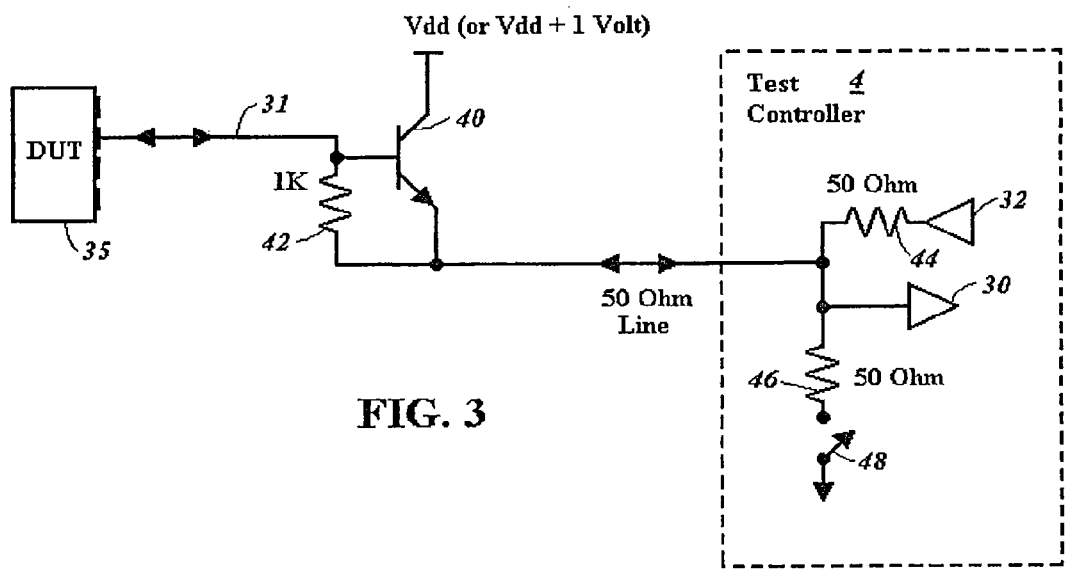
FIG. 3 shows an emitter follower transistor provided in a channel to enable a low power DUT signal to drive a test system according to one embodiment of the present invention.

FIG. 3 shows an emitter follower transistor 40 provided in a channel 31 to enable a low power, or low current DUT signal to drive a test system according to one embodiment of the present invention. The emitter follower transistor 40 is provided in the channel 31 with its base connecting to the DUT 35, its emitter connected to the test controller 4, the base and emitter being further connected together by a resistor 42. The resistor 42 provides a path for bi-directional signaling so that when the DUT 35 is driving the channel 31, the test controller 4 can provide signals to the DUT 35, and further so that the test controller 4 can drive the channel 31 as well as receive signals from the channel 31 to provide for parametric testing. The collector of transistor 40 is connected to a system power supply shown as Vdd in one embodiment. In another embodiment as illustrated in FIG. 3, the collector of transistor 40 is connected to Vdd+1V to compensate for an approximately 1V base-emitter Vbe drop through transistor 40. The compensation for Vbe allows the DUT 35 to drive signals up to Vdd. The emitter follower configuration is used because it has a voltage gain close to unity, hence a change in the base voltage appears as a constant voltage offset across the termination of the emitter with an increased drive current enabling a low output current DUT 35 to drive the 50 ohm transmission line and termination 46 or buffer 30. With a voltage gain of unity, accurate voltage test measurements can be performed by test controller 4 receiving the DUT 35 channel voltage that is offset by the constant voltage offset, Vbe, of transistor 40. Although one emitter follower configuration is illustrated in FIG. 3, it is understood that different emitter follower configurations could be used depending on design requirements.

The test controller 4 is shown including buffers, sometimes referred to as pin electronics, 30 and 32 that provide bi-directional signaling to and from the DUT 35. The test controller drive buffer 32 is shown provided through a resistor 44 that has a 50 Ohm value that matches the 50 Ohm impedance of the remaining channel line. In a typical test configuration that does not utilize this present invention, test controller driver 32 might be programmed to a high impedance or "tri-state" level when the DUT 35 is driving the channel and test signals are being measured through the comparator buffer 30 of test controller 4. With this present invention, the test controller 4 can alternately provide a convenient method of providing a 50 ohm pull down termination for transistor 40. When the driver 32 is used to provide a termination, it is simply programmed to a DC voltage. For example, if the low level voltage output of the DUT 35 is zero volts, the driver 32 could be programmed to have a fixed output voltage, e.g. −1.0 volts. In this case, when the DUT 35 is outputting zero volts, the voltage at comparator 30 would be Vbe of transistor 40 below zero volts. If Vbe=−0.7 volts, zero volts from DUT 35 would produce −0.7 volts at the input of comparator 30. The voltage across resistor 44 from comparator 30 to driver 32 would then be −0.7V−(−1.0V), or 0.3 volts.

Alternately, the test controller can physically include a pull down termination for the emitter-follower transistor. As shown in FIG. 3, the test controller 4 can include a switch 48 to selectively connect the channel 31 to ground or other reference voltage such as −1 volt to compensate for the Vbe voltage drop of transistor 40. The switch 48 is controlled by the test controller 4 to connect to ground and enable transistor 41 when signals are being transmitted from DUT 35. Similarly, the switch 48 is opened by the test controller 4 when signals are being transmitted from test controller through the output buffer 32. The path to ground through switch 48 is provided through a 50 Ohm resistor 46 to match the channel impedance as indicated above, although a different resistance value could be used depending on design requirements.

The resistor 42 provides a path for bi-directional signaling between the DUT 35 and the test controller 4, as indicated above. The resistor 42 is shown as a 1K device, providing a relatively low impedance path for signals to be transmitted from the test controller 4 to the DUT. The low impedance resistor 42 further provides a return path from the DUT 35 to the test controller 4 for parametric tests (i.e. DC leakage determined by forcing voltage and measuring current, and forcing current and measuring voltage). Typically, one of the drawbacks of providing buffering in the channel path, such as by using emitter follower transistor 40, is that the buffers prevent the test controller 4 from making DUT input pin open, short, and leakage tests sometimes referred to collectively as parametric tests. The buffering isolates the DUT so that return signals deliberately created using signals from the test controller 4 for short and open circuit tests will be blocked. Similarly, leakage current from a DUT will be blocked preventing leakage test measurements. Since parametric testing will be performed using transmissions from buffer 32, the switch 48 will be open and the emitter follower transistor 40 will be inactive, yet the resistor 42 still serves to provide a path for signals from the test controller buffer 32, and for return signals from the DUT, enabling parametric testing. Although a 1K device is shown for resistor 42, other low impedance bypass resistors can be used depending on design requirements.

Another drawback of including a buffer in the test channel is that bi-directional buffering elements are typically included, introducing the need to provide a direction control signal. In accordance with the present invention, a directional control signal is not required. When the DUT 35 is configured as an input pin, it has a high impedance input, typically mega-Ohms for a CMOS input device. Thus when the test controller 4 drives a signal from buffer 32, virtually no voltage drop occurs across resistor 42, and hence no current flow occurs in transistor 40 provided the collector remains reverse biased at Vdd or above the high level output voltage of driver 32. Hence when DUT 32 is driving the channel, transistor 40 operates as an emitter follower amplifier, and when the test controller 4 is driving the channel, transistor 40 is "off" and the path to DUT 35 is only through resistor 42. No additional control signal is required to change the signaling direction of the test channel.

Figure 4:
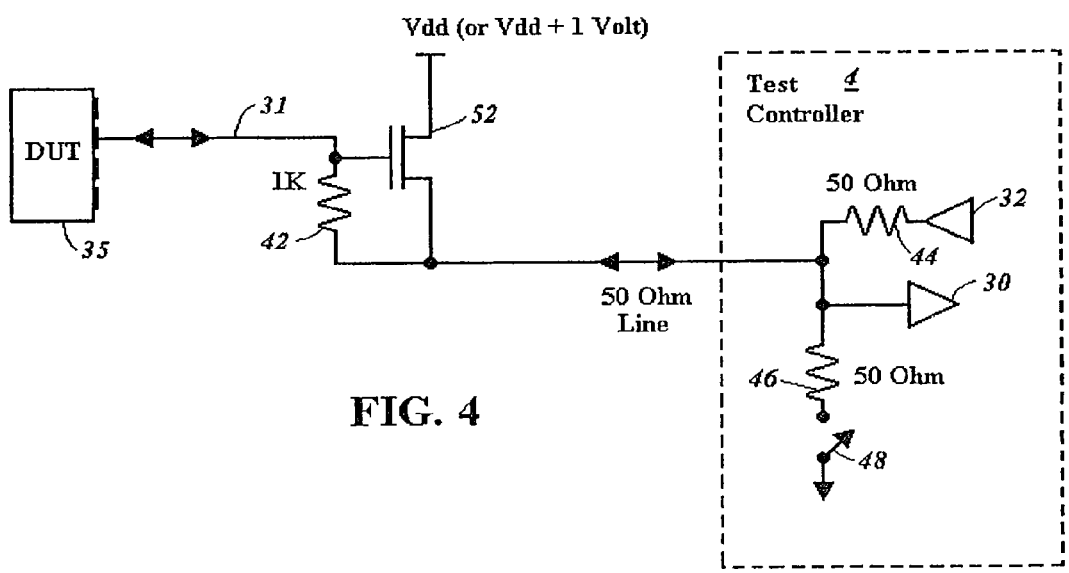
FIG. 4 shows the circuit of FIG. 3 modified to have a source-follower transistor replacing the emitter-follower transistor.

FIG. 4 shows the circuit of FIG. 3 modified to have a source-follower transistor 52 replacing the emitter-follower transistor 40. For convenience, components carried over from FIG. 3 to FIG. 4 are similarly labeled as will be components carried over in subsequent drawings. The source-follower transistor 52 of FIG. 4 is a FET amplifier with gate connected to the DUT 35, source connected to test controller 4, and drain connected to the system power supply voltage Vdd, or Vdd+1V to overcome the gate to source drop of approximately 1 V. As with FIG. 3, a low impedance bypass resistor 42 is used to provide for bi-directional signaling, and is connected between the gate and source of FET transistor 52. As with the emitter-follower configuration, the source-follower configuration is used because it has a voltage gain close to unity, hence a change in the gate voltage appears as an equal voltage change at the source enabling a low power DUT 35 to drive the channel line 31. Although one source follower configuration is illustrated in FIG. 4, it is understood that different source follower configurations could be used depending on design requirements.

Figure 5:
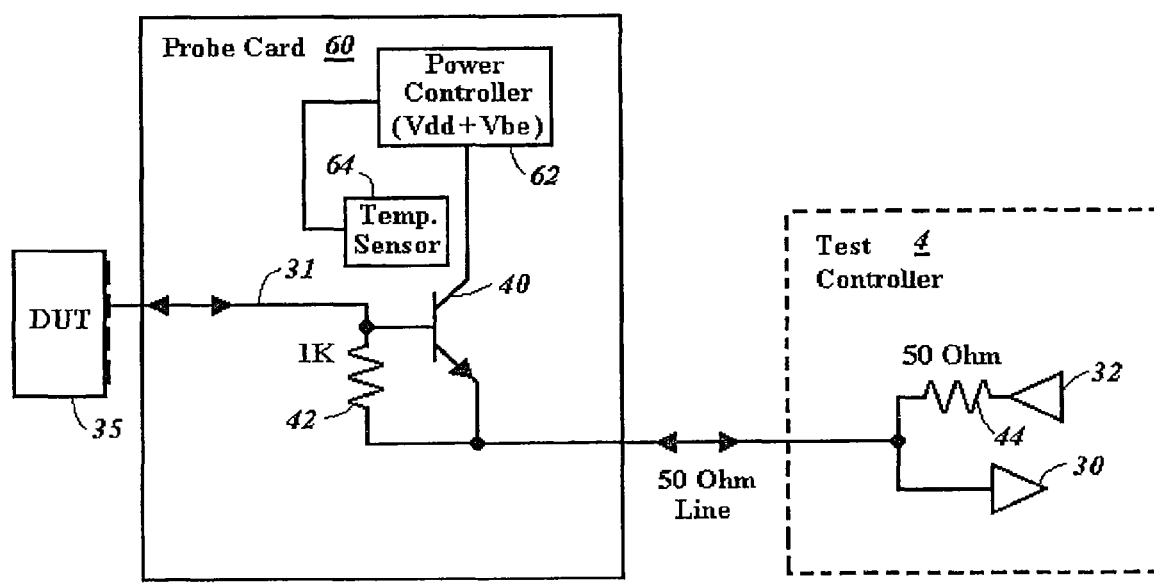
FIG. 5 shows the circuit of FIG. 3 modified to illustrate that the emitter-follower transistor can be included in a probe card along with temperature compensation to correct for voltage variations due to introduction of the emitter-follower transistor.

FIG. 5 shows the circuit of FIG. 3 modified to illustrate that the emitter follower transistor 40 can be included in a probe card 60, and the test system controller can provide a termination path directly through input buffer 30 as opposed to providing a switch 48 to connect to ground. Although it is contemplated that the emitter-follower transistor 40 or source follower transistor could be included in the test controller, preferably the transistor is provided in a probe card 60. The probe card provides a first advantage of placing the transistor 40 closer to the DUT 35 than the test controller 4 would provide, eliminating a larger portion of the channel 31 that the low power DUT would otherwise have to drive before reaching transistor 40. As a second advantage, costs can be reduced by including the transistor 40 in the probe card 60. Since not all DUT connections are low power, a limited number of transistors 40 could be provided on a probe card depending on the device being tested. Different probe cards could then be used for different tests at a significantly lower cost than modifying a test controller.

FIG. 5 further illustrates that the test controller 4 can use internal circuitry to provide a path to ground rather than having a separate switch, such as switch 48 of FIG. 3 installed to provide a path to ground. Internal controls of the test controller are programmed to recognize when the channel includes an emitter follower or source follower transistor and to accordingly provide a current sink for the transistor 40 using the driver 32 when the DUT is transmitting a low power signal.

The probe card 60 of FIG. 5 can further include power control circuit 62 such as a DC to DC converter that receives a voltage, such as a pin power supply voltage Vdd from an external power source and supplies the voltage to the collector of transistor 40. The power control circuit 62 can further be programmed or controlled to add a compensation voltage Vbe to the voltage Vdd at the collector of transistor 40 to assure that the output voltage at the emitter of transistor 40 has no offset. As an alternative to providing an additional voltage Vbe using the power control circuit 62, in one embodiment, the test controller 4 can be programmed to function as a pull-down termination that further compensates for the base to emitter voltage drop Vbe experienced by the emitter-follower transistor when operating to provide accurate test results.

FIG. 5 further illustrates that the probe card or other device containing the buffer transistor 40 can be configured to include a temperature sensor 64 to maintain accurate control of any voltage offset due to Vbe of the transistor 40. The voltage Vbe of transistor 42 typically varies by −2.5 mV per degree Celsius. To monitor temperature changes, in one embodiment a temperature sensor 64 is provided near each buffer transistor. A connection from the temperature sensor 64 to the power control circuit 62 enables control of Vbe with temperature to assure no voltage offset is provided at the output of buffer 40. As an alternative, the temperature sensor 64 can be connected to the test controller 4 directly so that voltage compensation can be provided in the test controller 4 using driver 32.

With compensation provided for Vbe changes vs. temperature, a calibration can be included to calibrate out any Vbe offset in test measurements due to temperature variations. The test controller 4, power control circuit 62 in the probe card 60, or other memory device can include the calibration of voltage versus temperature to enable such temperature compensation. A calibration can be performed in one embodiment by a system manufacturer, or in another embodiment as a user controlled procedure after start-up of the test system. Calibration can be performed by making measuring of devices with known characteristics using the probe card 60 over a range of temperatures.

Although the present invention has been described in conjunction with a system for testing DUTs on a wafer, it is contemplated that the system can likewise be used to test DUTs in other configurations, such as testing dies after they are separated from a wafer but prior to packaging where the test system is provided as part of a socket for inserting the die for testing.

Although the present invention has been described above with particularity, this was merely to teach one of ordinary skill in the art how to make and use the invention. Many additional modifications will fall within the scope of the invention, as that scope is defined by the following claims.

What is claimed is:

1. A probe card apparatus comprising:
a plurality of electrical connections to a tester for testing an electronic device;
a plurality of probes disposed to contact the electronic device;
a plurality of communications channels connecting ones of the electrical connections to ones of the probes; and
in a first one of the communication channels, a first amplifier for amplifying a signal output by the electronic device and received at a first one of the probes, the first amplifier providing the amplified signal to a first one of the electrical connections, and
a first by-pass resistor providing a resistive electrical path to the first of the probes by-passing the first amplifier for test signals output by the tester and received at the first one of the electrical connections, wherein:
the first amplifier is biased such that the first amplifier is off in response to a signal driven through the first one of the electrical connections to the first one of the probes, and
the first amplifier is biased such that the first amplifier is on in response to a signal driven through the first one of the probes to the first one of the electrical connections.

2. The probe card apparatus of claim 1, wherein the first amplifier is a current amplifier for amplifying a current of the signal output by the electronic device.

3. The probe card apparatus of claim 2 further comprising a power supply for supplying power to the first amplifier, the power having a voltage component sufficient for the amplifier to operate and the power having an additional voltage component sufficient to compensate for a voltage drop across the first amplifier.

4. The probe card apparatus of claim 1 further comprising:
a plurality of second amplifiers each for amplifying one of a plurality of second signals output by the electronic device and received at one of a second of the probes, each of the second amplifiers providing the one of the amplified second signals to one of a second plurality of electrical connections to the tester; and
a plurality of second by-pass electrical paths each for providing an electrical path to one of the second of the probes by-passing one of the second amplifiers for test signals output by the tester and received at one of the second electrical connections to the tester.

5. The probe card apparatus of claim 1, wherein the first communication channel is bi-directional.

6. The probe card apparatus of claim 1, wherein the first communication channel is passively bi-directional.

7. The probe card apparatus of claim 1, wherein the by-pass resistor is part of a by-pass path that is unswitched.

8. A probe card apparatus comprising:
a plurality of electrical connections to communications channels to a tester for testing an electronic device;
a plurality of probes disposed to contact the electronic device;
in a first communication channel, a first amplifier for amplifying a signal output by the electronic device and received at a first of the probes, the first amplifier providing the amplified signal to a first of the communications channels;
a first by-pass electrical path for providing an electrical path to the first of the probes by-passing the first amplifier for test signals output by the tester and received at the first connection to the first of the communications channels;
a temperature sensor; and
a power supply circuit connected to the temperature sensor, the power supply circuit providing a voltage to the first amplifier that varies with a temperature sensed by the temperature sensor.

9. The probe card apparatus of claim 8 further comprising a memory connected to the power supply circuit for storing data correlating temperature versus voltage to the first amplifier.

10. A method of testing an electronic device, the method comprising:
providing a plurality of test signals from a tester for controlling testing of the electronic device through a probe card apparatus comprising a plurality of communications channels between the tester and the electronic device, the providing comprising providing one of the test signals through a first by-pass resistor by-passing an amplifier disposed in a first one of the communications channels to a first probe in contact with the electronic device; and
amplifying an output signal output by the electronic device and received at the first probe with the amplifier to produce an amplified signal; and
providing the amplified output signal to the tester through the first communications channel,
wherein the first by-pass resistor by-passes the first amplifier.

11. The method of claim 10, wherein the amplifying comprises amplifying a current of the output signal.

12. The method of claim 11 further comprising providing power to the first amplifier, the power having a voltage component sufficient for the amplifier to operate and the power having an additional voltage component sufficient to compensate for a voltage drop across the first amplifier.

13. The method of claim 10, wherein the providing a plurality of test signals further comprises providing ones of the test signals through second by-pass paths of second ones of the communications channels to second probes in contact with the electronic device; and
amplifying output signals output by the electronic device and received at the second probes; and
providing the amplified output signals to the tester through the second communications channels,
wherein the second by-pass paths by-pass the second amplifiers.

14. The method of claim 10 further comprising selectively connecting an output of the first amplifier through a resistor to ground.

15. The method of claim 10 further comprising selectively providing a current sink path from an output of the first amplifier.

16. A method of testing an electronic device, the method comprising:
providing a plurality of test signals from a tester for controlling testing of the electronic device through ones of communications channels between the tester and the electronic device, the providing comprising providing one of the test signals through a first by-pass path of a first of the communications channels to a first probe in contact with the electronic device;
amplifying an output signal output by the electronic device and received at the first probe;
providing the amplified output signal to the tester through the first communications channel, wherein the first by-pass path by-passes the first amplifier;
sensing a temperature adjacent the first amplifier; and
varying a voltage component of power supplied to the first amplifier in accordance with the sensed temperature.

* * * * *